United States Patent
Leiba et al.

(10) Patent No.: US 8,536,954 B2
(45) Date of Patent: Sep. 17, 2013

(54) MILLIMETER WAVE MULTI-LAYER PACKAGING INCLUDING AN RFIC CAVITY AND A RADIATING CAVITY THEREIN

(75) Inventors: Yigal Leiba, Holon (IL); Elad Dayan, Beit-Dagan (IL)

(73) Assignee: Siklu Communication Ltd., Petach-Tikva (IL)

( * ) Notice: Subject to any disclaimer, the term of this patent is extended or adjusted under 35 U.S.C. 154(b) by 235 days.

(21) Appl. No.: 12/791,936

(22) Filed: Jun. 2, 2010

(65) Prior Publication Data

US 2011/0299256 A1 Dec. 8, 2011

(51) Int. Cl.
*H01P 5/107* (2006.01)

(52) U.S. Cl.
USPC ............................. 333/26; 333/33; 333/247

(58) Field of Classification Search
USPC ..................... 333/26, 33, 247; 257/664, 728
See application file for complete search history.

(56) References Cited

U.S. PATENT DOCUMENTS

| | | | |
|---|---|---|---|
| 3,255,408 A | 6/1966 | Walker | |
| 5,384,557 A | 1/1995 | Yoshida et al. | |
| 5,475,394 A | 12/1995 | Kohls et al. | |
| 5,982,250 A * | 11/1999 | Hung et al. | 333/26 |
| 6,060,959 A * | 5/2000 | Yakuwa | 333/26 |
| 6,320,543 B1 | 11/2001 | Ohata et al. | |
| 6,359,590 B2 | 3/2002 | Takenoshita | |
| 6,417,744 B1 * | 7/2002 | Albinsson et al. | 333/33 |
| 6,572,955 B2 | 6/2003 | Terashi et al. | |
| 6,573,808 B1 | 6/2003 | Burin | |
| 6,608,535 B2 | 8/2003 | Sherman et al. | |
| 6,822,528 B2 | 11/2004 | Dawn et al. | |
| 6,822,541 B2 * | 11/2004 | Sue et al. | 333/247 |
| 6,870,438 B1 * | 3/2005 | Shino et al. | 333/26 |
| 7,239,222 B2 * | 7/2007 | Nagaishi et al. | 333/247 |
| 7,498,907 B2 * | 3/2009 | Suzuki et al. | 333/247 |
| 2003/0012006 A1 | 1/2003 | Silverman | |
| 2004/0041657 A1 | 3/2004 | Paakonen et al. | |
| 2004/0145426 A1 | 7/2004 | Wu et al. | |
| 2005/0024166 A1 | 2/2005 | Ammar et al. | |
| 2006/0256016 A1 | 11/2006 | Wu et al. | |
| 2007/0085626 A1 | 4/2007 | Lee et al. | |
| 2007/0109070 A1 | 5/2007 | Singh | |
| 2009/0206473 A1 | 8/2009 | Lopez et al. | |
| 2009/0207090 A1 | 8/2009 | Pettus | |

FOREIGN PATENT DOCUMENTS

WO  WO 2011/030277  3/2011

OTHER PUBLICATIONS

International Search Report and the Search Report Dated Apr. 6, 2011 From the International Searching Authority Re. Application No. PCT/IB2010/054004.

Clenet et al. "Array of Laminated Waveguides for Implementation in LTCC Technology", Technical Memorandum, Defence Research and Development Canada, DRDC Ottawa TM 2006-227, 80 P., Nov. 2006.

\* cited by examiner

*Primary Examiner* — Benny Lee

(57) ABSTRACT

Millimeter wave radio-frequency integrated circuit device comprises a housing and a millimeter wave radio frequency integrated circuit, the housing comprising a plurality of layers laminated together and two cavities defined by apertures within the layers which are positioned to correspond as the layers are laminated together. The radio frequency integrated circuit is located within the first cavity, and the second cavity serves as a radiating cavity. The RFIC is bonded to a transmission line which connects to the radiating cavity.

18 Claims, 6 Drawing Sheets

MILLIMETER WAVE MULTI-LAYER PACKAGING INCLUDING AN RFIC CAVITY AND A RADIATING CAVITY THEREIN

FIELD AND BACKGROUND OF THE INVENTION

The present invention relates to a device and method for packaging of a millimeter wave radio frequency integrated circuit (RFIC) and, more particularly, but not exclusively to such a packaging method that inexpensively and efficiently couples the RFIC to the waveguide.

Typically an RFIC at these frequencies would be mounted directly on the target printed circuit board (PCB) and bonded directly to it. Packages may be used, and typically these involve materials such as low temperature co-fired ceramic (LTCC) and silicon, and focus on printed antenna elements.

LTCC is a well-established multi-layer technology which has been in use for many years in the microelectronics packaging industry. Each of the layers are processed in parallel and only brought together in an accurately aligned stack immediately prior to firing. This contrasts with serially produced multi-layer structures such as thick film hybrid interconnects and components such as ceramic capacitors. LTCC technology is particularly used in RF and high-frequency applications. In RF and wireless applications, LTCC technology is also used to produce multilayer hybrid integrated circuits, which can include resistors, inductors, capacitors, and active components in the same package. LTCC hybrids have a smaller initial ("non recurring") cost as compared with ICs, making them an attractive alternative to ASICs for small scale integration devices.

This technology presents advantages compared to other packaging technologies such as high temperature co-fired ceramic (HTCC). In LTCC, the ceramic is generally fired below 1000° C. due to a special composition of the material. This permits the co-firing to take place with highly conductive materials such as silver, copper and gold. LTCC also features the ability to embed passive elements, such as resistors, capacitors and inductors into the ceramic package, thus minimizing the size of the completed module.

An alternative is to use a ceramic based on a layer of aluminium and having a metal plug. Aluminium allows for molding and then etching of the components. The structure provides a platform, an upper layer and a cover.

In the known art, problems arise due to accuracy of the components, since with millimeter wave components, inaccuracies of a mere five microns can be critical. One solution is to use metal packaging. A metal box can be milled to very precise sizes. Also the metal has very good thermal properties so that heating due to radiation energy does not concentrate at particular location but is quickly dispersed.

The disadvantage with metal is price. Accurate machining makes the metal packaging very expensive. Nevertheless metal packaging is widely used in military applications, which are not price sensitive.

SUMMARY OF THE INVENTION

An electrical packaging method and device is provided for a bare die RFIC. The package can be directly coupled to a waveguide. The package provides the electrical connectivity, the mechanical support and the environmental isolation required for meeting the operation conditions of the RFIC.

According to one aspect of the present invention there is provided a millimeter wave radio-frequency integrated circuit device, comprising a housing and a radio frequency integrated circuit, the housing comprising a plurality of layers laminated together and a first cavity defined within the laminated layers, the radio frequency integrated circuit being located within the first cavity.

An embodiment may comprise a second cavity defined within the layers, the second cavity forming a radiating cavity for connection to a waveguide.

In an embodiment, the radiating cavity is capped by a laminated backshort.

In an embodiment, at least some of the layers are clad with metal.

In an embodiment, the laminate layers are separated by isolating laminate layers.

An embodiment may comprise conducting vias extending through at least some of the laminates.

An embodiment may comprise a cage of vias surrounding the radiating cavity.

An embodiment may comprise a grid of vias extending below the first cavity to conduct heat away from the RFIC.

An embodiment may comprise a mechanical laminate layer providing a floor to the first cavity.

An embodiment may comprise a radiating element extending into the second cavity.

In an embodiment, the radio frequency integrated circuit is connected to the radiating element via a printed passive radio frequency component.

In an embodiment, the radio frequency integrated circuit is connected to the printed passive radio frequency component or to the radiating element by at least one member of the group comprising bonding wires and a flip chip connection.

In an embodiment, the first cavity is sealed with a sealing cap.

In an embodiment, the sealing cap comprising radiation absorbing material.

An embodiment may comprise incorporating a bond matching structure at a point of connection of the radio frequency integrated circuit to a transmission line leading to the second cavity.

In an embodiment, the bond comprises a signal connection and first and second ground connections on either side at the radio frequency integrated circuits, the ground connections being connected to first and second ground pads disposed on either side of an extension of the transmission line, the signal connection being connected to the extension of the transmission line, the bond matching structure comprising convex bulges on either side of the extension faced by opposing matched concave intrusions on the ground pads.

According to a second aspect of the present invention there is provided a method of manufacturing a radio-frequency integrated circuit device, comprising:

machining apertures into a series of laminate layers;

laminating together the series of laminate layers such that the apertures form a first cavity;

placing a radio frequency integrated circuit into the cavity; and sealing the cavity.

An embodiment may involve machining further apertures into the laminate layers such that when they are laminated together a second, radiating, cavity is formed, and printing a transmission line to connect between the first cavity and the second cavity.

An embodiment may involve providing bond matching at a connection of the radio frequency integrated circuit to the transmission line.

An embodiment may involve providing the connection by:

providing a signal connection and first and second ground connections on either side of the signal connection on the integrated circuit;

connecting the ground connections and the signal connections respectively to ground pads and an extension of the transmission line;

providing convex bulges on either side of the extension;

providing opposing matched concave intrusions on the ground pads opposite the convex bulges.

According to a third aspect of the present invention there is provided a housing for a millimeter wave radio-frequency integrated circuit device, comprising:

a plurality of layers laminated together; and a first cavity defined within the laminated layers, the millimeter wave radio frequency integrated circuit being locatable within the first cavity.

An embodiment may comprise a second, radiating cavity defined within the laminated layers, and a transmission line printed on one of the laminated layers for connecting the radio frequency integrated circuit to the radiating cavity.

In an embodiment, the transmission line is a relatively low impedance transmission line, and is configured to match a relatively high impedance bond of the radio frequency integrated circuit.

In an embodiment, the configuration to match comprises convex bulges on either side of an extension of the transmission line faced by opposing matched concave intrusions on ground pads.

Unless otherwise defined, all technical and scientific terms used herein have the same meaning as commonly understood by one of ordinary skill in the art to which this invention belongs. The materials, methods, and examples provided herein are illustrative only and not intended to be limiting.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

BRIEF DESCRIPTION OF THE DRAWINGS

The invention is herein described, by way of example only, with reference to the accompanying drawings. With specific reference now to the drawings in detail, it is stressed that the particulars shown are by way of example and for purposes of illustrative discussion of the preferred embodiments of the present invention only, and are presented in order to provide what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice.

In the drawings.

DETAIL DESCRIPTION OF THE PREFERRED EMBODIMENTS

Figure 1:
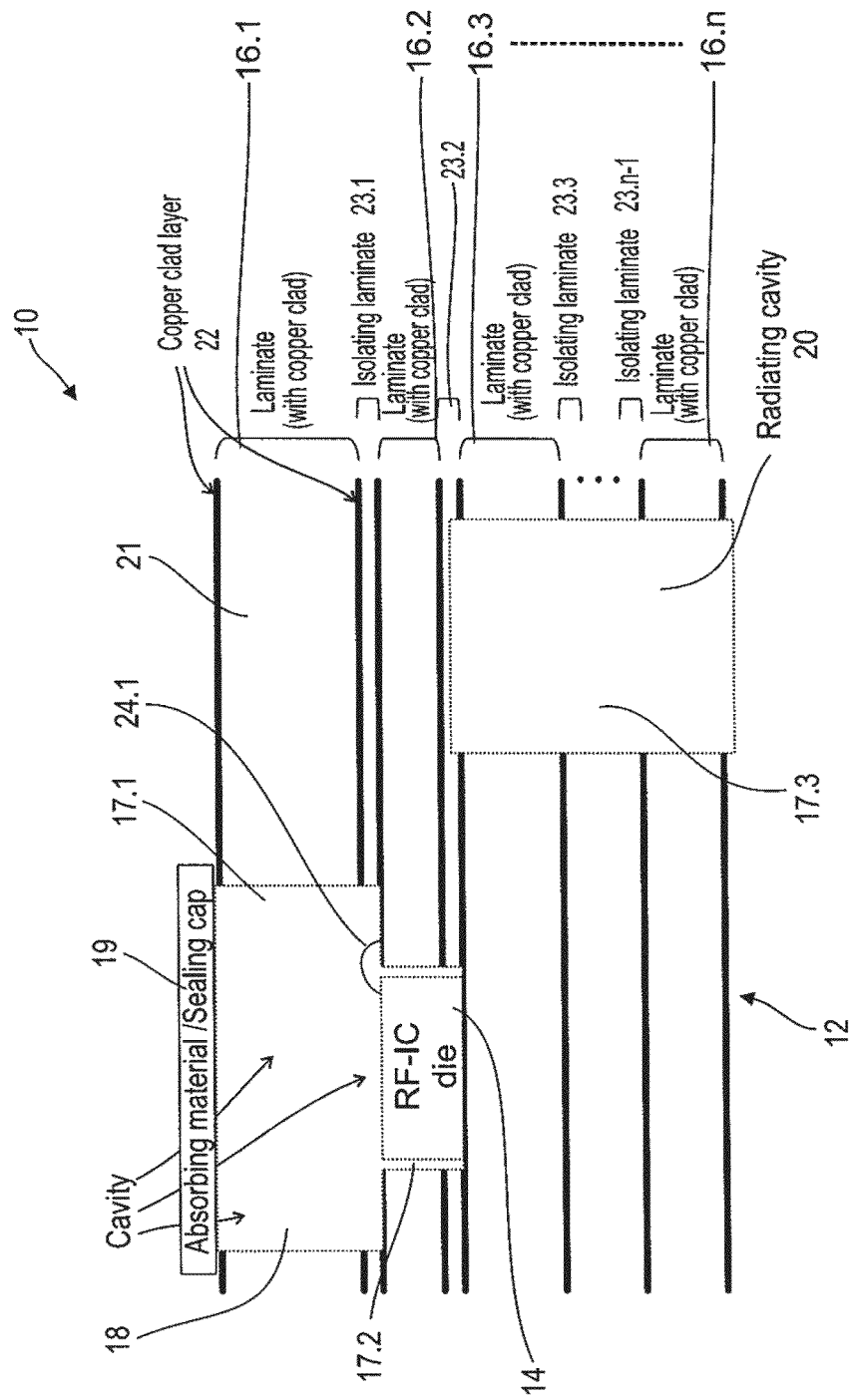
FIG. 1 is a simplified diagram illustrating a side view of a first millimeter wave RFIC laminated housing device according to the present embodiments.

The present embodiments may comprise an electrical packaging method for a bare die RFIC, which package can be directly coupled to a waveguide. The package provides the electrical connectivity, the mechanical support and the environmental isolation required for meeting the operation conditions of the RFIC. The embodiments may solve the problem of coupling RF (radio frequency) signal transmissions of a bare RFIC die to an antenna, via a waveguide. The transmission is normally conducted by very short bonding wires. Additionally the package provides the electrical connectivity and the environmental protection for the bare RFIC die.

A Radio-frequency integrated circuit device according to the present embodiments may comprise a laminate housing and a radio frequency integrated circuit. The housing may comprise a plurality of layers laminated together. Apertures are cut into the layers, and the apertures are made to correspond as the layers are laminated together, to form two cavities. The radio frequency integrated circuit is located within the first cavity and the second cavity serves as a radiating cavity. The RFIC is bonded to a transmission line which connects to the radiating cavity.

The present embodiments differ from the known art in using soft materials or PCB standard materials. The different layers can be etched to provide components or apertures as needed. The cavities are provided simply by aligning apertures and sealing.

The present embodiments may make a more tolerant electromagnetic structure than the prior art, although most of the losses are in the chip, not in the packaging structure. A structure according to the present embodiments may give performance which is a bit lower than that given by a fully metal package. The present structure may for example lose bandwidth due to the losses, but the bandwidth loss may be compensated for in the design.

The principles and operation of an apparatus and method according to the present invention may be better understood with reference to the drawings and accompanying description.

Before explaining at least one embodiment of the invention in detail, it is to be understood that the invention is not limited in its application to the details of construction and the arrangement of the components set forth in the following description or illustrated in the drawings. The invention is capable of other embodiments or of being practiced or carried out in various ways. Also, it is to be understood that the phraseology and terminology employed herein is for the purpose of description and should not be regarded as limiting.

Reference is now made to FIG. 1 which a simplified diagram is showing a lateral cross section of a radio-frequency integrated circuit device 10 which comprises a laminate housing structure 12 with cavities therein, and a radio frequency integrated circuit (RFIC) 14.

The laminate housing structure 12 comprises laminate layers 16.1 ... 16.n, all laminated together to form the housing structure 12. The layers are constructed with apertures, such as aperture 17.1 in layer 16.1, or aperture 17.2 in layer 16.2, or aperture 17.3 in layers 16.3 ... 16.n In the embodiment shown in FIG. 1 the apertures are aligned with other apertures during the lamination process to define cavities in the structure. Thus a first cavity 18 is formed from the alignment of apertures 17.1 and 17.2. The radio frequency integrated circuit 14 is located within this first cavity 18.

The first cavity may be sealed with a sealing cap 19. The cap 19 may be constructed of radiation-absorbing material. Cap 19 may be attached with adhesive or soldered in order to provide a hermetic seal.

A second cavity 20 is likewise defined from aperture 17.3 while forming the housing. The second cavity 20 may function as a radiating cavity, and be connected to a waveguide. An upper part of the cavity is labeled 21 and is discussed further in respect of FIG. 2.

The laminate layers 16.1 ... 16.n may respectively be clad with a layer of metal 22, for example copper. The metal cladding 22 may be on one side or on both sides of the layer. The laminate layers may be isolated from each other by separating them with isolating laminate layers. The isolating laminate layers are denoted in FIG. 1 by 23.1, 23.2, 23.3, ..., 23.n-1.

Wire bond or flip chip connection 24.1 links the RFIC 14 in the first cavity to the waveguide.

Figure 2:
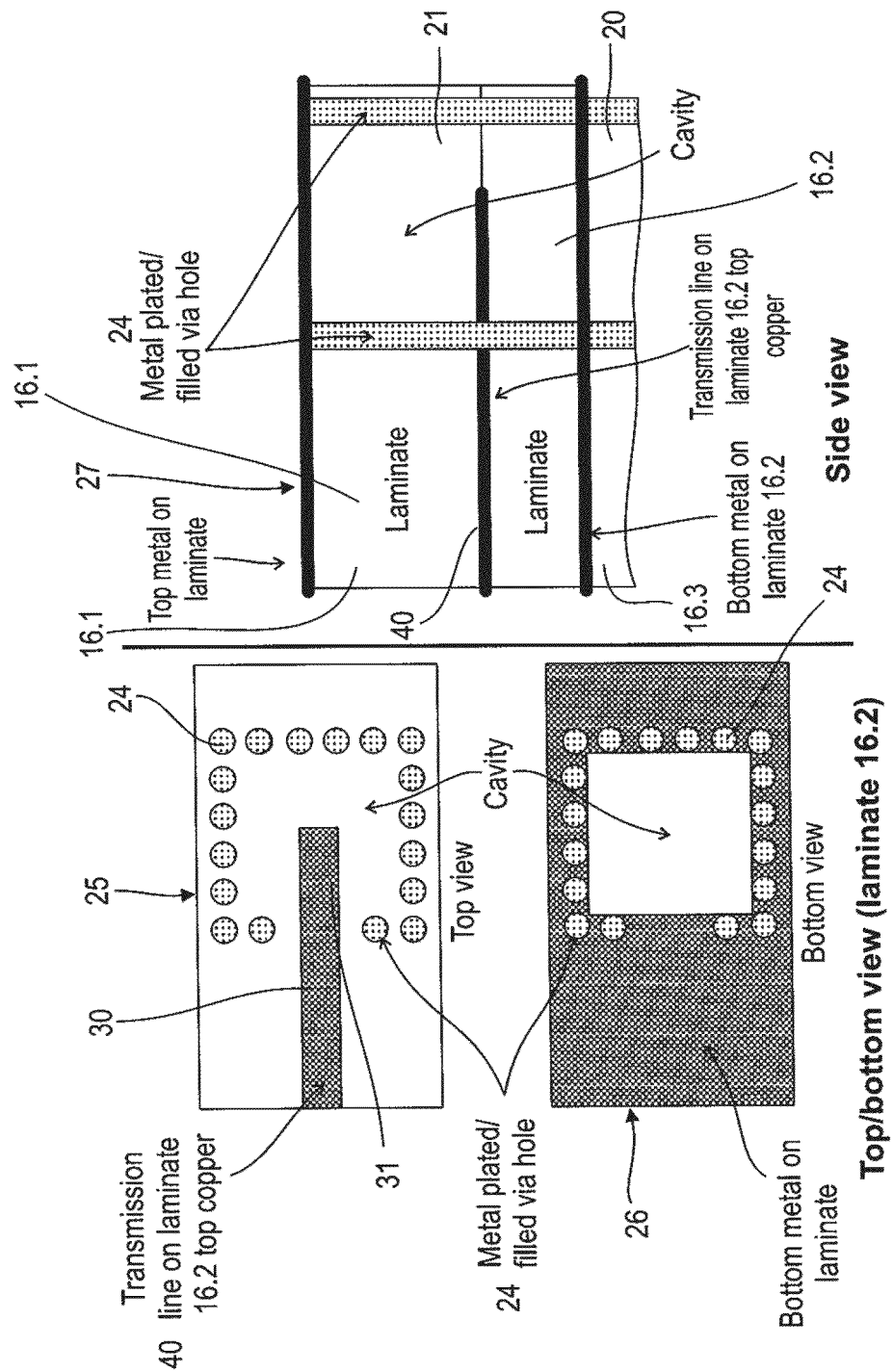
FIG. 2 is a simplified schematic diagram showing views from above, below and a cross section of internal structure of a further embodiment of the present invention.

Reference is now made to FIG. 2, which shows three details of the housing 12 of FIG. 1. An upper laminate layer 25 is shown in the top view. A lower laminate layer 26 is shown in the bottom view. A side view cross section 27 of laminate layers 16.1, 16.2 and 16.3 are shown. Conducting vias 24 extend through the laminates to connect together all the metal layers. The vias 24 may be formed by drilling holes and then plating or filling the holes with metal. The vias 24 are formed around aperture 17.3 in laminate layer 16.3 (FIG. 1) and extend through laminate layers 16.1 and 16.2 thus forming a radiating cavity having lower section 20 and upper section 21. It should be noted that in the embodiment shown the upper portion of radiating cavity 21 coincides with second or lower cavity 20 and the portion of radiating cavity 21 is not hollow but comprised of the material of laminate layers 16.1 and 16.2. A transmission line 40, located between laminate layers 16.1 and 16.2 may extend between the vias 24 into radiating cavity between upper portion 21 and lower portion 20 to form radiating element 30. As shown, the vias 24 may be placed evenly around the cavity except for a gap to allow the radiating element to extend through. It is not essential that the vias are placed evenly, however they may be placed tightly enough together that RF energy does not leak through.

In the present embodiments, some of the vias solve thermal issues arising from heating of the package due to radiation, and some solve electrical issues. Typically the vias 24 are all grounded, that is to say the vias 24 are provided for heat conduction, and may be positioned so that they do not act as stubs.

The structure shown in FIG. 2, together with the bonding structure shown in FIG. 4 which is discussed below may improve electromagnetic (EM) performance. The combined structure compensates for the lower accuracy in making the structure. In general, at the high frequencies of millimeter wave transmission, an inaccuracy of five microns can make a dramatic difference to performance. The present embodiments allow for working at high frequencies with the accuracies that are obtainable by common PCB manufacturing techniques.

Radiating element 30 is part of a planar transmission line to wave guide launcher. The launcher consists of the radiating element 30 and the radiating cavity 21 and shown in FIGS. 2 and 3. The wave guide launcher circuit takes advantage of the three-dimensional structure that may be created by using several laminate layers. It is based on the structure presented in copending U.S. patent application Ser. No. 11/554,987 filed on 8 Sep. 2009 entitled "Interfacing Between An Integrated Circuit And A Waveguide", the contents of which are hereby incorporated herein by reference. The launcher expands over its base by implementing a cavity backshort element over the radiation cavity. In the present embodiments the metal backshort taught in the above cited earlier application is replaced by PCB laminate layers. FIG. 2 shows side and top views of a preferred layout of the electro-magnetic laminates involved. Mechanical laminates are omitted for clarity. Specifically, in the exemplary implementation, the cavity is formed in the region surrounded by vias of laminate layer 16.1. Radiating element 30 may extend a tongue 31 into the radiating cavity 21.

In order to enable packaging of the RFIC, suitable apertures are machined in the laminates before they are pressed together. The mechanical laminates are used as the floor level for the cavities, and the required depth of the cavity determines which of the available mechanical laminates may be chosen as the floor. After pressing the laminates together these apertures become semi-sealed cavities into which the RFIC can be placed and bonded. After bonding, the cavity in which the RFIC is placed may be sealed by gluing sealing material above it. The sealing material may be a radiation absorbing material, for example ECCOSORB BSR radiation absorbing material provided by Emerson & Cuming, in order to prevent spurious RFIC oscillations.

An RFIC may dissipate a considerable amount of heat. For this reason the RFIC cavity requires cooling. Direct cooling is impossible, as the RFIC 14 is enclosed in its cavity. In order to overcome this obstacle, further metal-filled via holes referred to below are stacked as densely as possible in the mechanical laminate forming the floor of the cavity 18. The metal filling ensures that the cavity remains sealed, and improves the thermal conductivity. An exemplary structure is discussed in greater detail in reference to FIG. 6 below.

Figure 3:
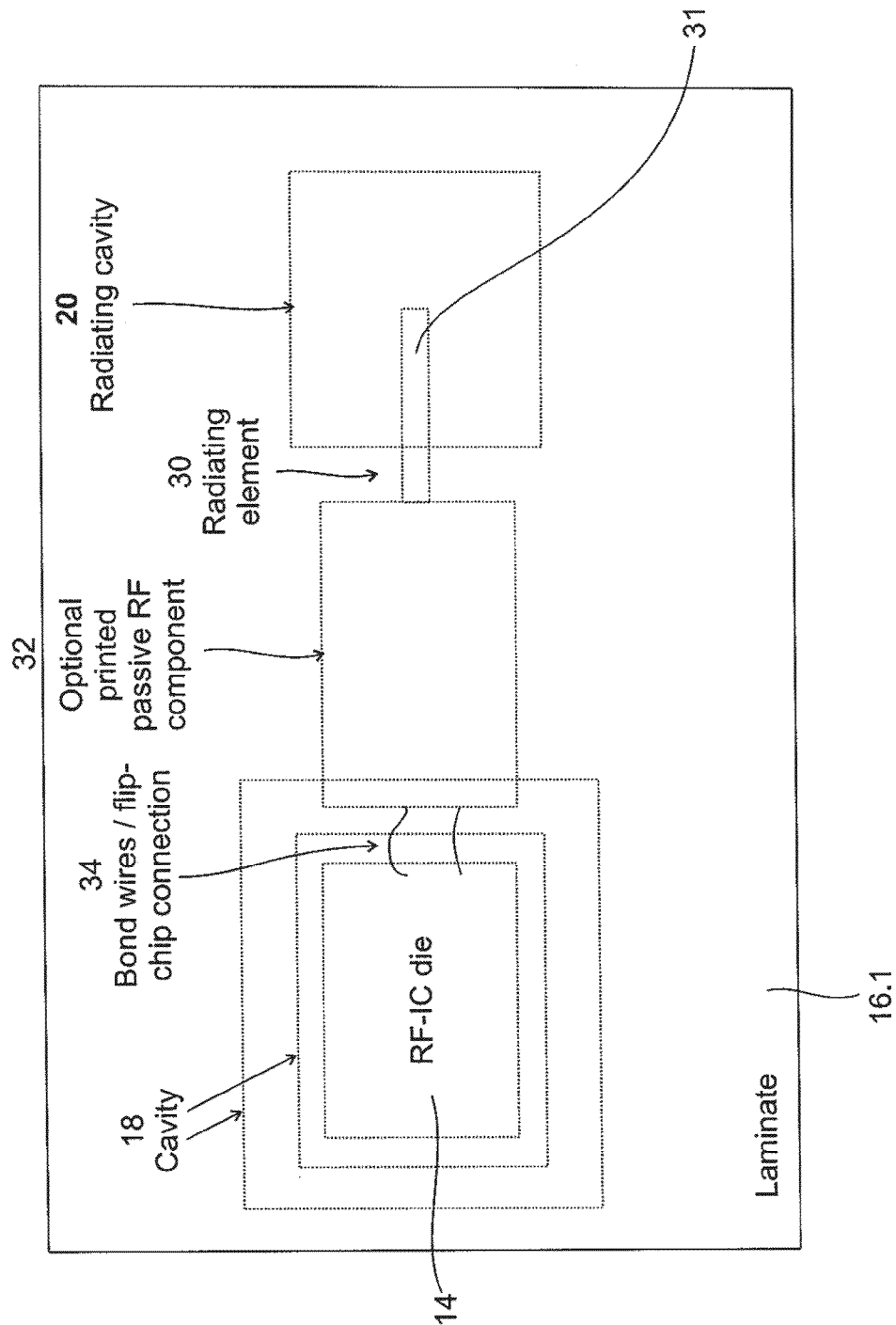
FIG. 3 is a simplified schematic diagram showing how printed components may connect between the RFIC and the radiating cavity in the present embodiments.

Reference is now made to FIG. 3, which is a schematic of a transverse cross section of the laminate housing taken across the base of upper laminate layer 16.1 of FIG. 1 and looking downwards through the two cavities 18 and 20. FIG. 3 illustrates structure built into the laminated layers which may connect the RFIC 14 to the radiating cavity 20.

RFIC 14 is located within first cavity 18. It is noted that in the embodiment shown, cavity 18 is a large box shaped cavity (formed by aperture 17.1 of FIG. 1) with a smaller box shaped cavity formed by rectangular aperture 17.2, of FIG. 1, extending out of it and into which smaller cavity the RFIC fits in, as clearly shown in side view in FIG. 1, where the two boundaries are shown in dotted lines.

Radiating element 30 may be printed on one of the laminated layers (16.1 ... 16.n). As shown in FIG. 3 Radiating element 30 may extend a tongue 31 into the radiating cavity 21.

It is possible to integrate various circuit components on the PCB, due to the fact that the RF signal reaches the PCB laminate. This integration is done either during the manufacturing of the PCB, as an integral part of its design, or by mounting these elements on the manufactured PCB. Some examples of components that can be integrated or mounted in this way are a power divider, such as a Wilkinson divider, an amplifier and an attenuator. The RFIC may thus optionally be connected to the radiating element 30 via a printed passive radio frequency component 32. Wilkinson dividers in particular may simply be printed directly onto a layer during manufacture. Bond wires 34 connect the RFIC 14 to a transmission element 30 such as radiating element 30, or to the optional printed component 32. Alternatively the connection 34 between RFIC 14 and the radiating element 30 can be made using flip chip technology as is well known in the art.

Figure 4:
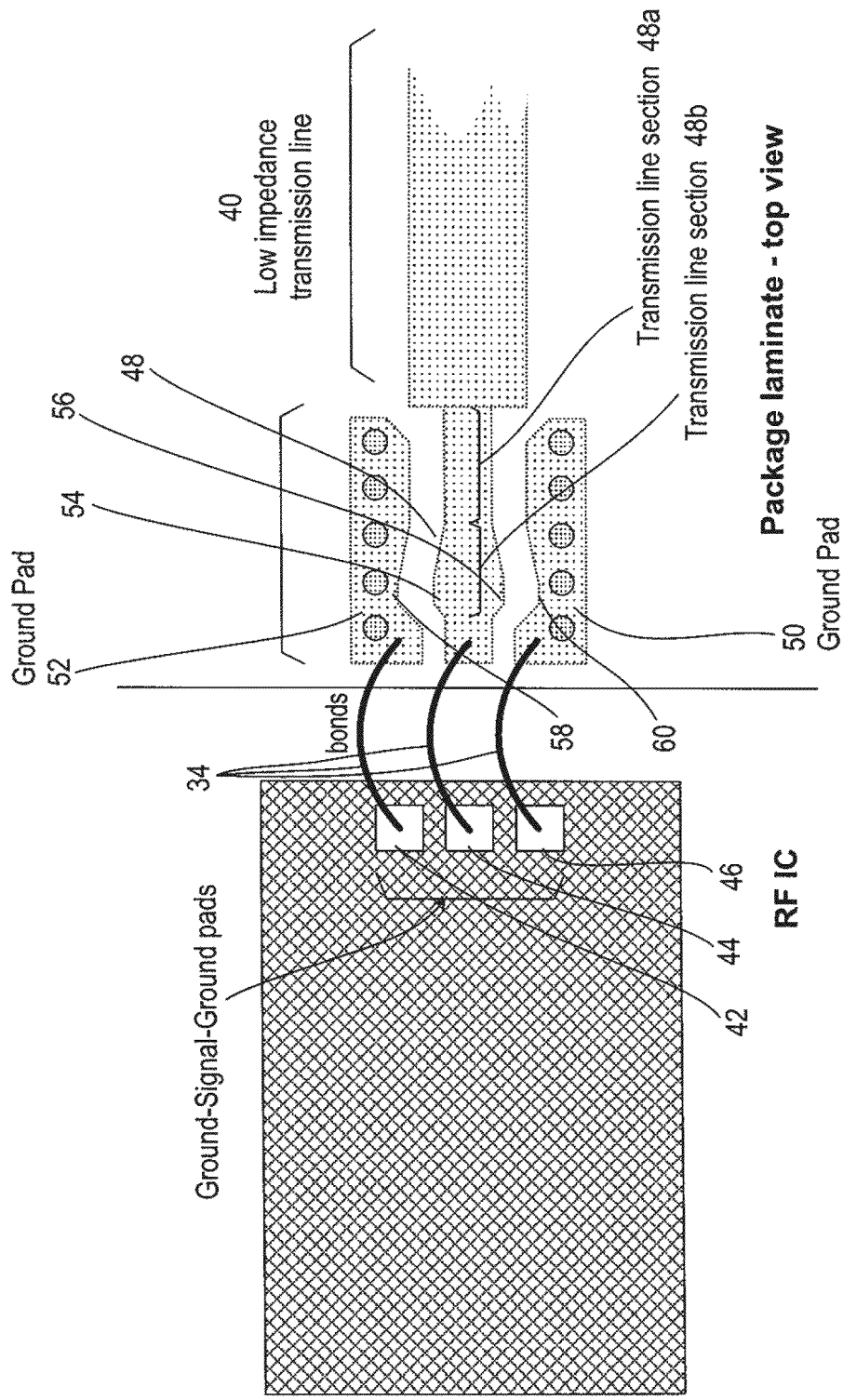
FIG. 4 is a detail showing bond matching between the high impedance RFIC bond and the low impedance transmission line, according to an embodiment of the present invention.

Reference is now made to FIG. 4, which is a detail of the structure in FIG. 3, and specifically showing schematically how to provide a bond matching structure according to an exemplary embodiment of the present invention. The RFIC 14 may be connected to a transmission line 40 which may in turn lead to the printed passive radio frequency component 32 discussed in FIG. 3, if included. If there is no passive component then transmission line 40 leads directly to the radiating element 30 of FIG. 3. As discussed above bonding wires 34 may connect the RFIC 14 to the transmission line 40, and, the above-mentioned alternative of a flip chip connection may also be used.

The detail of FIG. 4 shows the connection of the bonding wires 34 to transmission line 40. Preferably transmission line 40 is low impedance. Typically, there are three terminals on the RFIC 14, ground 42, signal 44, and a second ground terminal 46, each having its own respective bonding wire. The signal bonding wire is connected to an extension 48 of the transmission line 40. The ground bonding wires are connected to ground pads 50 and 52. A bond matching structure is built into the transmission line extension and the ground pads at the point at which the radio frequency integrated circuit connects to the transmission line 40. The matching structure comprises convex bulges 54 and 56 on either side of the signal connection. The bulges are faced by opposing matched concave intrusions 58 and 60 on the ground pads. The bulges and corresponding intrusions may be wedge shaped with the steep portion of the wedge towards the RFIC.

The bond matching structure as described minimizes power loss. Without using a ground-signal-ground matching circuit power loss results when connecting between the RFIC 14 and the transmission line 40 on the PCB layer. The power loss is a direct result of a mismatch between the bond itself, which is high impedance, and the low impedance transmission lines on the PCB. If the matching circuit is not placed right at the point where the bonds meet the PCB, it is still possible to create a matching circuit, but the resulting matching circuit will become a narrow-band element, and thus less useful.

In greater detail, a ground-signal-ground bond matching circuit as shown in FIG. 4 may be provided. The ground-signal-ground pad pattern (42-44-46) on the chip may be connected to the PCB by bonding wires (or bond strips) 34. The practically realizable bonding wire impedance is typically high (100 Ohm or more) at mm-wave frequencies, and since its length is not a negligible part of the wavelength, the bond wires need to be matched to the low impedance transmission lines used on the PCB laminate. The matching circuit may consist of two transmission line sections 48a and 48b, whose length and impedance are selected to provide the best match between the chip output impedance and the impedance of the transmission line used on the PCB. The matching circuit further includes the ground pads 50 and 52 that may connect to the PCB ground plane using vias or by other methods practiced in RF design.

In general, the use of standard PCB manufacturing technology is limited by a process resolution of about 4 mil, and laminate layers that may be used in PCB manufacturing may have thickness variation of as much as 10% during processing. These limitations pose a significant challenge to the mm-wave electro-magnetic design. This challenge is approached by the electro-magnetic design, and in particular the bond matching structure discussed above.

Figure 5:
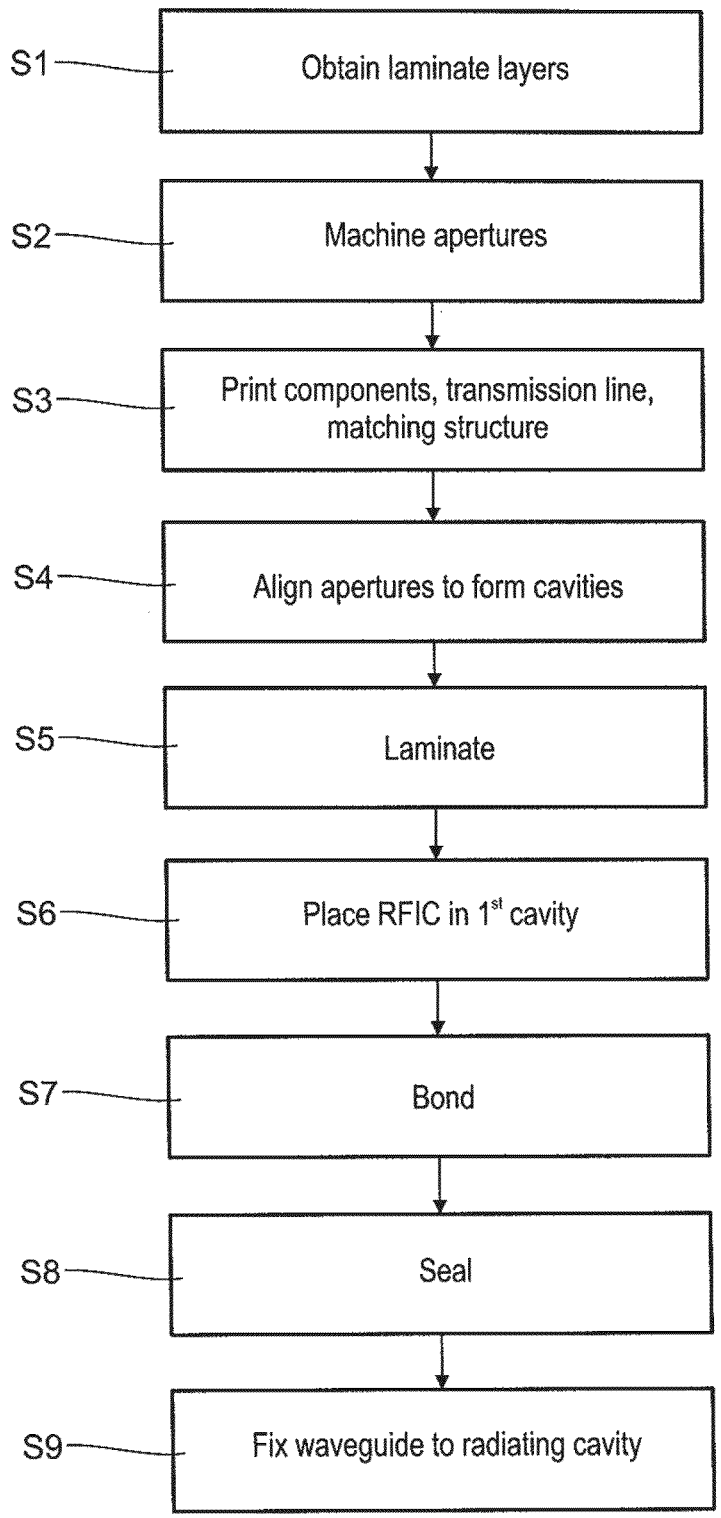
FIG. 5 is a simplified flow chart illustrating a procedure for manufacturing a housing according to an embodiment of the present invention.

Reference is now made to FIG. 5, which is a simplified flow chart illustrating a method of manufacturing a radio-frequency integrated circuit device. The method comprises obtaining laminate layers at step S1, and machining apertures, and for that matter holes for vias, into the layers at step S2. Components and a transmission line may be printed on the mechanical lamination layer at the base of the RFIC cavity at step S3. As explained in connection with FIG. 4 the bonds may be matched to the transmission line. The apertures are aligned at step S4 to form cavities and then the layers are laminated together at step S5. The RFIC is then placed in the first cavity at step S6 and bonded at step S7 to connect it to the second, radiating, cavity that is also formed in the housing. The RFIC is then sealed at step S8 in its cavity. As will be apparent to those skilled in the art the order of performance of steps S1 to S8 may be varied, carried out only in part or the like. For example machining of the aperture at step S2 may be carried out after printing of components, transmission lines and matching structure at step S3. Printing of components, transmission lines and matching structure S3 can be performed in part, followed by laminating at step S5 and at a later stage perform another part of S3.

Optionally a waveguide may be fixed to the radiating cavity S9. Alternatively the device may be provided without the waveguide, and the fixing of the waveguide may be left for a later stage or for the end user.

As explained above, transmission line 40 is optionally provided to couple radiation between the RFIC cavity 18 and the radiating cavity 24-20. The transmission line may be printed onto the laminate layer forming the floor 66 (shown in FIG. 6) of the first cavity. During printing of the transmission line 40, bond matching may be provided at the connection of the RFIC and the transmission line, for example by building corresponding shapes, 52-54, 56-58, into the signal connection 48 and into surrounding ground pads 50, 52, as discussed above in respect of FIG. 4. Thus, convex bulges 54, 56, may be constructed on either side of the signal connection faced by opposing matched concave intrusions 52, 58, on the ground pads 50, 52.

Figure 6:
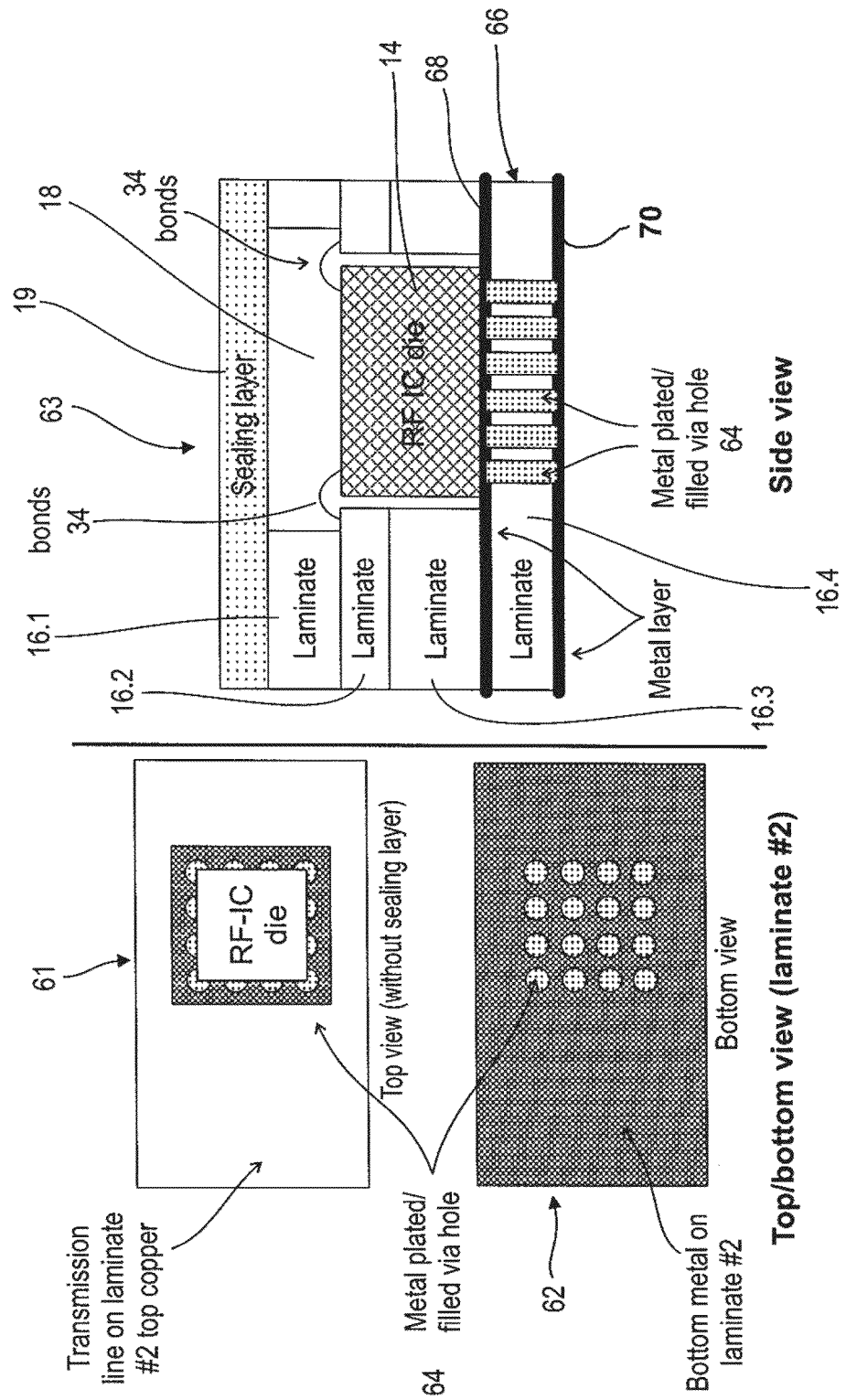
FIG. 6 is a simplified diagram illustrating internal structure of the housing around the RFIC cavity and showing vias for thermal conductivity.

Reference is now made to FIG. 6, which is a simplified diagram showing further details of the RFIC cavity 18 according to the present embodiments. FIG. 6 shows a view (without the sealing layer) 61 from above cavity 18, a view 62 from below cavity 18 and a side view vertical cross-section 63 of cavity 18. The RFIC 14 sits in cavity 18, sealed in by sealing layer 19, over an arrangement of vias 64 in the floor 66 of cavity 18 formed within laminate layers 16.1, 16.2, 16.3 and 16.4. The RFIC is bonded via bonds 34 to the transmission line on the PCB layer using suitable bonding technology such as aluminum or gold bond wires/strip. A metal layer 68 on top of laminate layer 16.4 forms the base of cavity 18. Vias 64 extend between metal layer 68 and metal layer 70 at the base of laminate layer 16.4. The concentrated arrangement of vias underneath the RFIC is to conduct heat from the RFIC and prevent overheating, as discussed elsewhere.

The embodiments are now considered in greater detail. Returning to FIG. 1, the RFIC package 10 may be constructed by laminating layers of various laminate substances using PCB manufacturing technology to construct a mechanical housing 10 and connectivity for the RFIC die.

Each laminate layer may be selected for a specific dielectric constant, and for particular dielectric losses. As mentioned, each layer may be clad on both sides by a metal, typically copper. The dielectric constant and losses are part of the properties of the laminates. The skilled person will be able to vary the dielectric constants of the different layers to obtain any presently required electromagnetic efficiency.

There is a choice of laminate type, and the choice is largely a commercial issue. As discussed below, there is an issue of the separation between mechanical and electromagnetic roles of the various laminate layers in the structure. Some of the laminate layers in the package serve an electro-magnetic purpose while other layers serve a mechanical purpose. Those layers that serve an electro-magnetic purpose, say laminate layer 16.1 and laminate layer 16.2 in FIG. 2, are chosen to be low loss materials for the relevant RF frequency. Various PTFE based laminate materials may be suitable. The laminate layer at the floor of the RFIC cavity, laminate layer 16.4 in FIG. 6, serves a mechanical role.

Embodiments allow implementation of various desired mm wave components within the packaging. For instance, in the example described here several major mm-wave components are implemented:

The laminates may be isolated from each other by means of isolating laminate layers as shown in FIG. 1. The isolating laminate layers are also provided with a specific dielectric constant, and particular dielectric losses.

In an embodiment, in order to enable packaging the RFIC, suitable apertures are machined in the laminate layers before they are pressed together. After pressing the laminates together these apertures become semi-sealed cavities into which the RFIC can be placed and bonded. After bonding, the cavity in which the RFIC is placed may be sealed by gluing sealing material above it. The sealing material may also be a radiation absorbing material, to prevent spurious RFIC oscillations. In FIG. 1, the sealing material is shown as sealing cap 19.

As discussed, the RFIC is connected to one of the laminate layers, and the connection may use any suitable bonding (or flip-chip) technology. Once the RF signal has reached a PCB laminate, various passive components, such as component 32, can be designed on the PCB, to modify the RF energy prior to coupling the RF energy to the radiating element 30. The radiating element 30 is also printed on one of the PCB laminates, and radiates into the radiating cavity. The radiating cavity is prepared using a similar technique as used for preparing the RFIC cavity, namely cutting apertures into the laminate layers and aligning the apertures prior to laminating them together.

The radiating cavity may be directly coupled to a waveguide, and may appear as a natural extension of the waveguide once the waveguide is mechanically attached to the device.

The present embodiments thus use cavities made by alignment of apertures in a multi-laminate PCB to create a sealed enclosure for the RFIC. Specific passive microwave elements may be inserted between the RFIC and the radiating element by printing of the PCB. The radiating element extends into the radiating cavity, and the radiating cavity may itself be covered with a laminated backshort. The RFIC may then be simply coupled within the package directly to the waveguide by means of the radiating cavity.

The present embodiments may enable low cost packaging of mm-wave and microwave ICs, and their coupling to a waveguide.

The laminate PCB may be hermetically sealed, the sealing may in particular be hermetic to water, and the result is cheaper than other technologies in use.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims. All publications, patents, and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. Millimeter wave radio-frequency integrated circuit device, comprising
a housing and a radio frequency integrated circuit (RFIC);
the housing comprising a plurality of layers laminated together and a first cavity defined within said plurality of layers laminated together, the radio frequency integrated circuit being located within said first cavity, the layers being non-ceramic and the device further comprising a second cavity defined within said layers, said second cavity forming a radiating cavity for connection to a waveguide, wherein at least some of the plurality of layers laminated together are separated by additional layers, said additional layers being isolating laminate layers.

2. The device of claim 1, wherein said first cavity is sealed with a sealing cap.

3. The device of claim 2, wherein said sealing cap comprising radiation absorbing material.

4. The device of claim 1, wherein at least some of said layers are clad with metal.

5. The device of claim 1, wherein said radiating cavity is capped by a laminated backshort.

6. The device of claim 1, further comprising conducting vias extending through at least some of said plurality of layers laminated together.

7. The device of claim 6, comprising a grid of vias extending below said first cavity to conduct heat away from said RFIC.

8. The device of claim 1, further comprising conducting vias extending through at least some of said plurality of layers laminated together and a cage of vias surrounding said radiating cavity.

9. The device of claim 1, further comprising a mechanical laminate layer providing a floor to said first cavity.

10. The device of claim 1, further comprising a radiating element extending into said second cavity.

11. The device of claim 10, wherein said radio frequency integrated circuit is connected to said radiating element via a printed passive radio frequency component.

12. The device of claim 11, wherein said radio frequency integrated circuit is connected to said printed passive radio frequency component or to said radiating element by at least one member of the group comprising bonding wires and a flip chip connection.

13. Millimeter wave radio-frequency integrated circuit device, comprising:
 a housing and a radio frequency integrated circuit (RFIC);
 the housing comprising a plurality of layers laminated together and a first cavity defined within said plurality of layers laminated together, the radio frequency integrated circuit being located within said first cavity, the layers being non-ceramic and the device further comprising a second cavity defined within said layers, said second cavity forming a radiating cavity for connection to a waveguide, wherein said non-ceramic layers comprise PTFE based laminate materials.

14. The device of claim 13, wherein said PTFE-based laminate materials are manufactured using PCB manufacturing technology.

15. Millimeter wave radio-frequency integrated circuit device, comprising
 a housing and a radio frequency integrated circuit (RFIC);
 the housing comprising a plurality of layers laminated together and a first cavity defined within said plurality of layers laminated together, the radio frequency integrated circuit being located within said first cavity, wherein at least some of the plurality of layers laminated together are separated by additional layers, said additional layers being isolating laminate layers.

16. Millimeter wave radio-frequency integrated circuit device, comprising:
 a housing and a radio frequency integrated circuit (RFIC);
 the housing comprising a plurality of layers laminated together and a first cavity defined within said plurality of layers laminated together, the radio frequency integrated circuit being located within said first cavity, the layers being non-ceramic and the device further comprising a second cavity defined within said layers, said second cavity forming a radiating cavity for connection to a waveguide, the device further incorporating a bond matching structure for providing a bond at a point of connection of said radio frequency integrated circuit to a transmission line leading to said second cavity, wherein said bond comprises a signal connection and first and second ground connections on either side of said signal connection at said radio frequency integrated circuit, said first and second ground connections being connected to first and second ground pads disposed on either side of an extension of said transmission line, said signal connection being connected to said extension of said transmission line, said bond matching structure comprising convex bulges on either side of said extension faced by opposing matched concave intrusions on said first and second ground pads.

17. A method of manufacturing a radio-frequency integrated circuit device, comprising:
 machining apertures into a series of non-ceramic laminate layers;
 laminating together said series of non-ceramic laminate layers such that said apertures form a first cavity;
 placing a radio frequency integrated circuit into said first cavity; and
 sealing said first cavity;
 machining further apertures into said series of laminate layers such that when said series of laminate layers are laminated together, a second, radiating, cavity is formed for connection to a waveguide, and printing a transmission line to connect between said first cavity and said second cavity;
 providing bond matching at a connection of said radio frequency integrated circuit to said transmission line, and wherein providing said connection comprises:
 providing a signal connection and first and second ground connections on either side of said signal connection on said radio frequency integrated circuit;
 connecting said first and second ground connections and said signal connection respectively to ground pads and an extension of said transmission line;
 providing convex bulges on either side of said extension;
 providing opposing matched concave intrusions on said ground pads opposite said convex bulges.

18. Housing for a millimeter wave radio-frequency integrated circuit device, comprising:
 a plurality of layers laminated together, the layers being non-ceramic;
 a first cavity defined within said plurality of layers laminated together, said millimeter wave radio frequency integrated circuit being locatable within said first cavity;
 a second cavity defined within said layers, said second cavity forming a radiating cavity for connection to a waveguide;
 a transmission line printed on one of said plurality of layers laminated together for connecting said radio frequency integrated circuit to said radiating cavity, wherein said transmission line is a relatively low impedance transmission line, and is configured to match a relatively high impedance bond of said radio frequency integrated circuit, said transmission line being configured to match said high impedance bond of said radio frequency integrated circuit comprises convex bulges on either side of an extension of said transmission line faced by opposing matched concave intrusions on ground pads.

* * * * *